United States Patent [19]

Brooks

[11] Patent Number: 5,446,455
[45] Date of Patent: Aug. 29, 1995

[54] AUTO-CALIBRATED CURRENT-MODE DIGITAL-TO-ANALOG CONVERTER AND METHOD THEREFOR

[75] Inventor: Todd L. Brooks, Boston, Mass.

[73] Assignee: Motorola Inc., Schaumburg, Ill.

[21] Appl. No.: 160,645

[22] Filed: Dec. 2, 1993

[51] Int. Cl.$^6$ .............................................. H03M 1/68
[52] U.S. Cl. ................................. 341/145; 341/118
[58] Field of Search .............. 341/118, 120, 122–125, 341/144, 145

[56] References Cited

U.S. PATENT DOCUMENTS

| | | | |
|---|---|---|---|
| 2,221,926 | 6/1940 | Jackson | 341/118 |
| 4,835,535 | 5/1989 | Shibayama et al. | 341/120 |
| 4,947,172 | 8/1990 | Suzuki | 341/145 |
| 4,998,108 | 3/1991 | Ginthner et al. | 341/145 |
| 5,017,919 | 5/1991 | Hull et al. | 341/136 |
| 5,055,847 | 10/1991 | Rybicki et al. | 341/162 |
| 5,087,914 | 2/1992 | Sooch et al. | 341/120 |
| 5,227,793 | 7/1993 | Aisu | 341/136 |
| 5,243,347 | 9/1993 | Jackson et al. | 341/144 |
| 5,321,401 | 6/1994 | White | 341/147 |

OTHER PUBLICATIONS

J. Hughes et al., "Switched-Current Signal Processing for Video Frequencies and Beyond", IEEE Journal of Solid-State Circuits, vol,. 28, No. 3, Mar. 93, pp. 314–322.

D. Groeneveld et al., "A Self-Calibration Technique for Monolithic High-Resolution D/A Converters", IEEE Journal of Solid-State Circuits, vol. 24, No 6, Dec. 89, pp. 1517–1522.

Primary Examiner—Marc S. Hoff
Attorney, Agent, or Firm—Daniel D. Hill

[57] ABSTRACT

A current-mode DAC (20) includes two sub-DACs (22, 36), and a calibrated attenuator (48). One sub-DAC (22) receives least-significant-bits (LSB) of a K-bit digital input signal, and the second sub-DAC (36) receives most-significant-bits (MSB) of the K-bit digital input signal. An output of the sub-DAC (22) is attenuated by an attenuator (50), and the attenuated signal is summed with an output of the second sub-DAC (36) to form an analog output signal. A 4-phase gain adjust sample and hold circuit (49) is used to calibrate the attenuator (50). The 4-phase gain adjust sample and hold circuit (49) samples the current from the attenuator (50), and removes device mismatch effects in the attenuator (50) which cause linearity errors in the current-mode DAC (20).

20 Claims, 3 Drawing Sheets

PHASE 1: CLOSE SWITCHES 85, 86, 70, 71, 80, 81, AND 83 TO SAMPLE $I_{SIGN}/I_{SIGP}$ FOR CALIBRATION
PHASE 2: CLOSE SWITCHES 68, 69, 79, 81, 83, 87, AND 88 TO CALIBRATE THE SCALE FACTOR
PHASE 3: CLOSE SWITCHES 85, 86, 70, 71, 80, 81, AND 83 TO SAMPLE $I_{SIGN}/I_{SIGP}$
PHASE 4: CLOSE SWITCHES 82, 84, AND 79 TO HOLD AND ADJUST $I_{SIGN}/I_{SIGP}$ FOR ATTENUATOR ERROR

AUTO-CALIBRATED CURRENT-MODE DIGITAL-TO-ANALOG CONVERTER AND METHOD THEREFOR

FIELD OF THE INVENTION

This invention relates generally to digital-to-analog converters, and more particularly, to an auto-calibrated current-mode digital-to-analog converter.

BACKGROUND OF THE INVENTION

In present telecommunications and digital audio systems, digital-to-analog converters (DACs) having higher resolution, as well as requiring less surface area on an integrated circuit are needed. Linearity errors that reduce resolution and accuracy in an analog output signal may be caused by processing variations and component value mismatching. To achieve higher resolution, relatively large surface area, and/or special equipment, such as laser trimmers, may be required. In addition, various calibration techniques have been used to improve linearity of the analog output signal. One calibration technique used with current-mode DACs is disclosed in "A Self-Calibration Technique For Monolithic High-Resolution D/A Converters", by Groeneveld et al., IEEE Journal of Solid-State Circuits, Vol. 24, No. 6, December 1989, pp. 1517–22, and involves calibrating each current source element in the converter independently. A current-mode DAC uses current instead of voltage to represent an analog signal. The DAC is implemented using $2^K + 1$ current source elements, where K represents the number of bits received by the DAC. During every clock cycle, $2^K$ of the elements are switched to the output or to ground depending on the DAC input code. The one remaining current source element is calibrated relative to a reference current source. During each clock cycle, a different current source element is calibrated until eventually all of the elements have been calibrated. The calibration cycle then repeats.

A problem with the calibrated current source implementation is that it may require a very large number of current source elements to implement a high resolution DAC. For example, a 12-bit DAC requires $2^{12}$, or 4096 elements. To reduce the number of current source elements in a DAC, one common technique is to use two smaller DACs together with a divide-by-$2^N$ attenuator. N represents the number of bits in each of the two DACs. In this manner, a high resolution DAC can be implemented using two low resolution DACs. For example, a 12-bit DAC can be implemented using two 6-bit DACs. Each 6-bit DAC requires $2^6$, or 64 current source elements. Thus, a 12-bit DAC can be simplified from 4096 elements to 128 elements. However, the divide-by-$2^N$ attenuator should be accurate in order to maintain high-linearity in the DAC. A typical divide-by-$2^N$ attenuator is implemented using a current divider in a current-mode DAC, however, the accuracy of the current divider can be degraded by device mismatch. This can be a significant problem in high resolution DACs requiring high linearity.

SUMMARY OF THE INVENTION

Accordingly, there is provided, in one form, a current-mode digital-to-analog converter, a first sub-DAC, a second sub-DAC, an attenuator, a gain adjust sample and hold circuit, and a summing element. The first sub-DAC has a plurality of current sample and hold circuits. The first sub-DAC receives a reference current and a plurality of least-significant-bits of a K-bit digital signal, where K is an integer. In response, the first sub-DAC provides a first analog signal corresponding to the plurality of least-significant-bits. The second sub-DAC has a plurality of current sample and hold circuits. The second sub-DAC for receives the reference current and a plurality of most-significant-bits of the K-bit digital signal. In response, the second sub-DAC provides a second analog signal corresponding to the plurality of most-significant-bits. The attenuator is coupled to the first sub-DAC, and attenuates the first analog signal in order to provide an attenuated first analog signal. The gain adjust sample and hold circuit adjusts the attenuated first analog signal with a constant scale factor to compensate for device mismatch errors in the attenuator, and provides an adjusted attenuated first analog signal. The summing element receives the adjusted attenuated first analog signal and the second analog signal, and in response, provides an output analog signal.

In another embodiment, a method for removing device mismatch effects in the attenuator which cause nonlinearity errors in the current-mode digital-to-analog converter is provided. These and other features and advantages will be more clearly understood from the following detailed description taken in conjunction with the accompanying drawings.

DESCRIPTION OF A PREFERRED EMBODIMENT

Generally, the present invention provides an auto-calibrated current-mode digital-to-analog converter. A division ratio of a current dividing attenuator of the current-mode digital-to-analog converter is calibrated in order to remove linearity errors caused by device mismatch effects in the current dividing attenuator. This is accomplished by providing two sub-DACs. One sub-DAC receives the least-significant-bits (LSB) of a K-bit digital input signal, and a second sub-DAC receives the most-significant-bits (MSB) of the K-bit digital input signal, where K is an integer. An output of the LSB sub-DAC is attenuated, and the attenuated signal is summed with an output of the MSB sub-DAC to form an analog output signal corresponding to the K-bit digital input signal. A 4-phase gain adjust sample and hold circuit is used to calibrate the current-dividing attenuator. The 4-phase gain adjust circuit samples the current from the attenuator, replicates the current, and scales it with a constant scale factor. The constant scale factor is provided by a calibrated sample and hold current element, and removes the device mismatch effects which cause linearity errors in the DAC.

Figure 1:
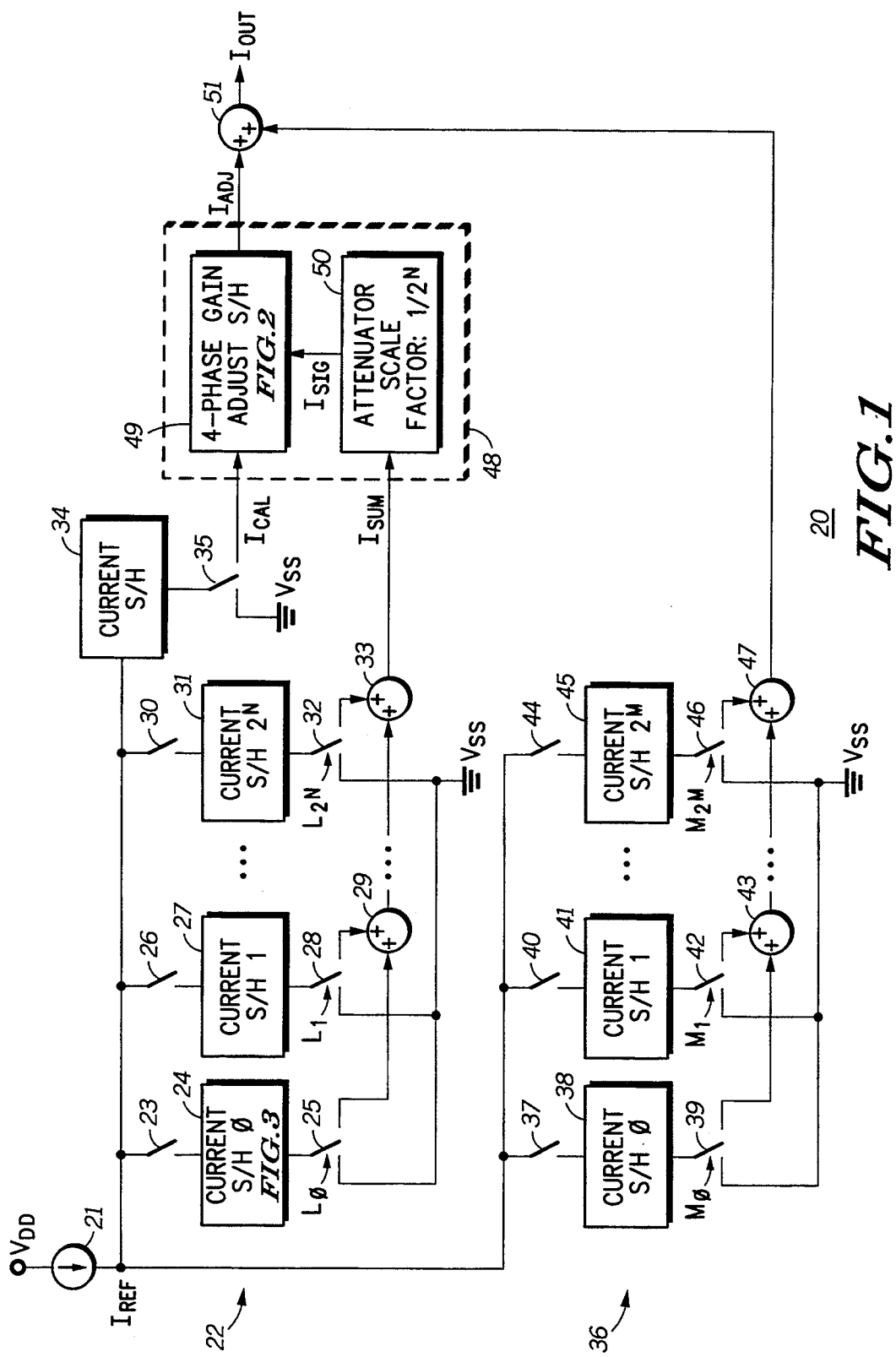
FIG. 1 illustrates in block diagram form, a current-mode DAC in accordance with the present invention.

The present invention can be more fully described with reference to FIG. 1–FIG. 3. FIG. 1 illustrates in block diagram form, current-mode DAC 20 in accordance with the present invention. Current-mode DAC 20 includes current source 21, sub-DAC 22, sub-DAC 36, current sample and hold circuit 34, switch 35, calibrated attenuator 48, and summing element 51. Sub-DAC 22 includes switches 23, 26, and 30, current sample and hold circuits 24, 27, and 31, switches 25, 28, and 32, and summing elements 29 and 33. Sub-DAC 36 includes switches 37, 40, and 44, current sample and hold circuits 38, 41, and 45, switches 39, 42, and 46, and summing elements 43 and 47. Calibrated attenuator 48 includes 4-phase gain adjust sample and hold circuit 49 and attenuator 50.

Current source 21 has a first terminal connected to a power supply voltage terminal labeled $V_{DD}$, and a second terminal for providing a reference current labeled "$I_{REF}$". In sub-DAC 22, switches 23, 26, and 30 each have a first terminal connected to the second terminal of current source 21 for receiving reference current $I_{REF}$, and a second terminal. Current sample and hold circuit 24 has a first terminal connected to the second terminal of switch 23, and a second terminal. Current sample and hold circuit 27 has a first terminal connected to the second terminal of switch 26, and a second terminal. Current sample and hold circuit 31 has a first terminal connected to the second terminal of switch 30, and a second terminal. Switch 25 has a first terminal connected to the second terminal of current sample and hold circuit 24, a second terminal connected to a first input terminal of summing element 29, and a third terminal connected to a power supply voltage terminal labeled "$V_{SS}$". Switch 28 has a first terminal connected to the second terminal of current sample and hold circuit 27, a second terminal connected to a second input terminal of summing element 29, and a third terminal connected to $V_{SS}$. Switch 32 has a first terminal connected to the second terminal of current sample and hold circuit 31, a second terminal connected to a first input terminal of summing element 33, and a third terminal connected to $V_{SS}$. An output terminal of summing element 29 is connected to a second input terminal of the next summing element in line, as indicated by the series of dots at the output terminal of summing element 29.

In sub-DAC 36, switches 37, 40, and 44 each have a first terminal connected to the second terminal of current source 21 for receiving reference current $I_{REF}$, and a second terminal. Current sample and hold circuit 38 has a first terminal connected to the second terminal of switch 37, and a second terminal. Current sample and hold circuit 41 has a first terminal connected to the second terminal of switch 40, and a second terminal. Current sample and hold circuit 45 has a first terminal connected to the second terminal of switch 44, and a second terminal. Switch 39 has a first terminal connected to the second terminal of current sample and hold circuit 38, a second terminal connected to a first input terminal of summing element 43, and a third terminal connected to $V_{SS}$. Switch 42 has a first terminal connected to the second terminal of current sample and hold circuit 41, a second terminal connected to a second input terminal of summing element 43, and a third terminal connected to $V_{SS}$. Switch 46 has a first terminal connected to the second terminal of current sample and hold circuit 45, a second terminal connected to a first input terminal of summing element 47, and a third terminal connected to $V_{SS}$. An output terminal of summing element 43 is connected to a second input terminal of the next summing element in line, as indicated by the series of dots at the output terminal of summing element 43.

Current sample and hold circuit 34 has a first terminal connected to the second terminal of current source 21, and a second terminal. Switch 35 has a first terminal connected to the second terminal of current sample and hold circuit 34, a second terminal connected to $V_{SS}$, and a third terminal. In calibrated attenuator 48, attenuator 50 has an input terminal connected to the output terminal of summing element 33, and an output terminal. 4-phase gain adjust sample and hold circuit 49 has an input terminal connected to the output terminal of attenuator 50, and an output terminal. Summing element 51 has a first input terminal connected to the output terminal of 4-phase gain adjust sample and hold circuit 49, a second input terminal connected to the output terminal of summing element 47, and an output terminal for providing an analog output signal labeled "$I_{OUT}$".

Current-mode DAC 20 converts a digital signal comprising K-bits, to a corresponding analog signal. Sub-DAC 22 receives N-bits of the decoded digital signal and sub-DAC 36 receives M-bits of the decoded digital signal. There can be more than two sub-DACs, as illustrated in FIG. 3. In current-mode DAC 20, the N-bits represent the least-significant-bits and the M-bits represent the most-significant-bits of the K-bit digital signal. M does not have to be equal to N. Sub-DAC 22 has $2^N+1$ current sample and hold circuits. Sub-DAC 36 has $2^M+1$ current sample and hold circuits. Current sample and hold circuits 24, 27, 31, 34, 38, 41, and 45 are each conventional current-mode sample and hold circuits. Switches 25, 28, 32, 39, 42, and 46 receive digital signals from the decoder (not shown), where the digital signals from the decoder correspond to the K-bit digital input signal. Switches 25, 28, and 32 represent the switches used by sub-DAC 22. Switch 25 responds to decoded signal $L_0$, switch 28 responds to decoded signal $L_1$, and switch 32 responds to decoded signal $L_2^N$. Switches 39, 42, and 46 represent the switches used by sub-DAC 36. Switch 39 responds to decoded signal $M_0$, switch 42 responds to decoded signal $M_1$, and switch 46 responds to decoded signal $M_2^M$.

Note that there is one additional current sample and hold circuit in each of sub-DACs 22 and 36 than is required for receiving a decoded analog signal. The additional current sample and hold circuit is needed to allow one of the current sample and hold circuits to be calibrated while the other current sample and hold circuits are outputting data. Current-mode DAC 20 has two phases. During a first phase of operation, switch 23 of sub-DAC 22 is closed, coupling current sample and hold circuit 24 to current source 21 for calibrating current sample and hold circuit 24. The remaining switches 26 and 30 are open, while current sample and hold circuits 27 and 31 are outputting their respective values depending on the position of switches 28 and 32. For example, if decoded signal $L_1$ represents a logic "zero", switch 28 will be positioned to couple current sample and hold circuit 27 to $V_{SS}$. If decoded signal $L_1$ represents a logic "one", switch 28 will be positioned to couple current sample and hold circuit 27 to the first input terminal of summing element 29. During a second phase of operation, switch 26 of sub-DAC 22 is closed, coupling current sample and hold circuit 27 to current source 21 for calibrating current sample and hold circuit 27. The remaining switches 23 and 30 are open, while current sample and hold circuits 24 and 31 are outputting their respective values depending on the position of switches 25 and 32. Sub-DAC 36 operates in the same manner, except the sub-DAC follows the operation of sub-DAC 22 by two phases of operation. Therefore, the operation of current-mode DAC 20 can be described as being "pipelined". Note that logic and decoding circuits used for controlling the switches of current-mode DAC 20 are unimportant for purposes of describing the invention, and are therefore not shown.

The outputs of each of the current sample and hold circuits of sub-DAC 22 are summed together, resulting in an analog current labeled "$I_{SUM}$" being provided to attenuator 50. Attenuator 50 is a conventional current divider circuit that divides current $I_{SUM}$ by a scale factor of $\frac{1}{2}^N$ plus a device mismatch error, if any, to provide an attenuated analog current labeled "$I_{SIG}$" to 4-phase gain adjust sample and hold circuit 49. 4-phase gain adjust sample and hold circuit 49 has 4 phases, and removes the device mismatch error, and provides an adjusted attenuated analog current labeled "$I_{ADJ}$" to summing element 51. Summing element 51 sums currents $I_{ADJ}$ and the analog current from summing element 47 to provide analog output signal $I_{OUT}$ corresponding to the K-bit digital input signal. Since 4-phase gain adjust sample and hold circuit 49 operates in 4 phases, it requires a clock frequency that is twice as high as that required for the 2 phases of current-mode DAC 20. The operation of 4-phase gain adjust sample and hold circuit 49 will be discussed in detail later.

Figure 2:
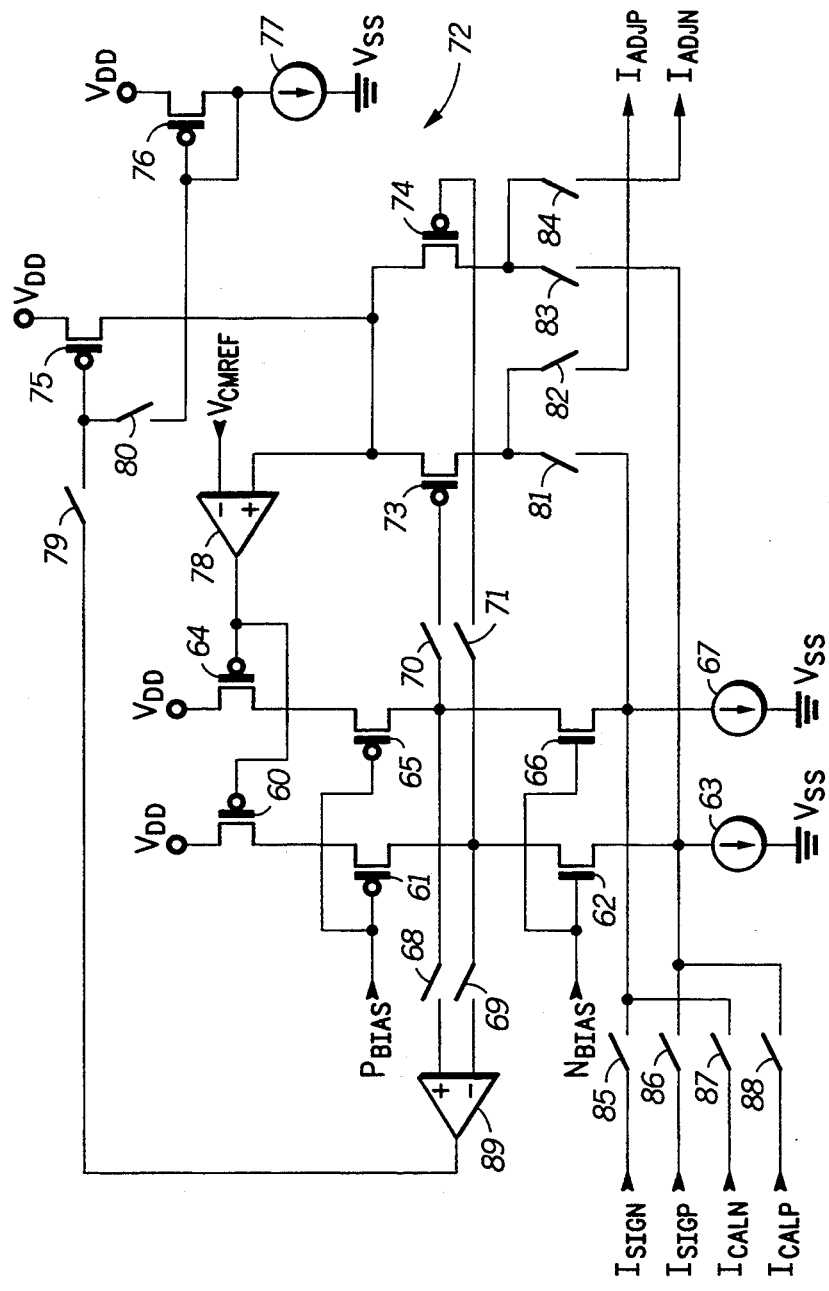
FIG. 2 illustrates in schematic diagram form, the 4-phase gain adjust sample and hold circuit of FIG. 1.

FIG. 2 illustrates in schematic diagram form, 4-phase gain adjust sample and hold circuit 49 of FIG. 1. 4-phase gain adjust sample and hold circuit 49 includes P-channel transistors 60, 61, 64, 65, 75, and 76, N-channel transistors 62 and 66, current sources 63, 67, and 77, differential amplifiers 78 and 89, differential pair 72, and switching elements 68–71, 79 and 80, and 81–88. Differential pair 72 includes P-channel transistors 73 and 74.

P-channel transistor 60 has a source connected to $V_{DD}$, a gate, and a drain. P-channel transistor 61 has a source connected to the drain of P-channel transistor 60, a gate for receiving bias voltage labeled "$P_{BIAS}$", and a drain. N-channel transistor 62 has a drain connected to the drain of P-channel transistor 61, a gate for receiving a bias voltage labeled "$N_{BIAS}$", and a source. Current source 63 has a first terminal connected to the source of N-channel transistor 62, and a second terminal connected to $V_{SS}$. P-channel transistor 64 has a source connected to $V_{DD}$, a gate connected to the gate of P-channel transistor 60, and a drain. P-channel transistor 65 has a source connected to the drain of P-channel transistor 64, a gate connected to the gate of P-channel transistor 61 for receiving bias voltage $P_{BIAS}$, and a drain. N-channel transistor 66 has a drain connected to the drain of P-channel transistor 65, a gate connected to the gate of N-channel transistor 62 for receiving bias voltage $N_{BIAS}$, and a source. Current source 67 has a first terminal connected to the source of N-channel transistor 66, and a second terminal connected to $V_{SS}$. P-channel transistor 75 has a source connected to $V_{DD}$, a gate, and a drain. P-channel transistor 73 has a source connected to the drain of P-channel transistor 75, a gate, and a drain. P-channel transistor 74 has a source connected to the source of P-channel transistor 73, a gate, and a drain. P-channel transistor 76 has a source connected to $V_{DD}$, and a gate and a drain connected together. Current source 77 has a first terminal connected to the gate and drain of P-channel transistor 76, and a second terminal connected to $V_{SS}$. Differential amplifier 78 has a non-inverting input terminal connected to the sources of differential pair 72, an inverting input terminal for receiving a common-mode reference voltage labeled "$V_{CMREF}$", and an output terminal connected to the gates of P-channel transistors 60 and 64.

Switch 70 has a first terminal connected to the drain of P-channel transistor 65, and a second terminal connected to the gate of P-channel transistor 73. Switch 71 has a first terminal connected to the drain of P-channel transistor 61, and a second terminal connected to the gate of P-channel transistor 74. Switch 68 has a first terminal connected to the drain of P-channel transistor 65, and a second terminal. Switch 69 has a first terminal connected to the drain of P-channel transistor 61, and a second terminal. Differential amplifier 89 has a non-inverting input terminal connected to the second terminal of switch 68, an inverting input terminal connected to the second terminal of switch 69, and an output terminal. Switch 79 has a first terminal connected to the output terminal of differential amplifier 89, and a second terminal connected to the gate of P-channel transistor 75. Switch 80 has a first terminal connected to the gate of P-channel transistor 75, and a second terminal connected to the gate and drain of P-channel transistor 76. Switch 85 has a first terminal for receiving a current labeled "$I_{SIGN}$", and a second terminal connected to the source of N-channel transistor 66. Switch 86 has a first terminal for receiving a current labeled "$I_{SIGP}$", and a second terminal connected to the source of N-channel transistor 62. Switch 87 has a first terminal for receiving a calibration current labeled "$I_{CALN}$", and a second terminal connected to the source of N-channel transistor 66. Switch 88 has a first terminal for receiving a calibration current labeled "$I_{CALP}$", and a second terminal connected to the source of N-channel transistor 62. Switch 81 has a first terminal connected to the drain of P-channel transistor 73, and a second terminal connected to the source of N-channel transistor 66. Switch 82 has a first terminal connected to the drain of P-channel transistor 73, and a second terminal for providing a current labeled "$I_{ADJP}$". Switch 83 has a first terminal connected to the drain of P-channel transistor 74, and a second terminal connected to the source of N-channel transistor 62. Switch 84 has a first terminal connected to the drain of P-channel transistor 74, and a second terminal for providing a current labeled "$I_{ADJN}$".

Each of the switches shown in FIG. 1 and FIG. 2 are conventional switching elements and comprise complementary metal-oxide semiconductor (CMOS) transmission gates or individual N-channel transistors. It should be apparent, however, that many different circuit elements can be used for the switching elements.

Calibrated attenuator 48 has 4 modes, or phases of operation: 1) sample attenuated differential current $I_{SIGN}/I_{SIGP}$ for calibration; 2) calibrate the scale factor to adjust for attenuator error due to device mismatches; 3) sample attenuated differential current $I_{SIGN}/I_{SIGP}$; and 4) hold to the output and scale to adjust for the attenuator linearity error. During phase 1, switches 85, 86, 70, 71, 80, 81, and 83 are closed, all of the other switches are open. In addition, all of the $2^N + 1$ current sample and hold circuits, represented by current sample and hold circuits 24, 27, and 31, are summed and provided as a full scale differential current $I_{SUM}$. Full scale differential current $I_{SUM}$ is received at the input terminal of attenuator 50 from summing element 33, and is $2^N$ times larger than differential calibration current $I_{CALN}/I_{CALP}$ from current sample and hold circuit 34. (Note: differential calibration current $I_{CALN}/I_{CALP}$ will be applied during phase 2.) The current sample and hold circuits that generate differential calibration current $I_{CALN}/I_{CALP}$ and differential current $I_{SUM}$ are independently calibrated to ensure accuracy. Differential current $I_{SUM}$ is attenuated by attenuator 50 to produce attenuated differential current $I_{SIGN}/I_{SIGP}$. Attenuator 50 comprises a conventional current dividing circuit. A differential current through N-channel transistors 62 and 66 is equal to the difference between attenuated differential current $I_{SIGN}/I_{SIGP}$ and the differential drain current of P-channel transistors 73 and 74. The differential current through N-channel transistors 62 and 66 causes a large differential voltage at the drains of N-channel transistors 62 and 66, which in turn causes a change in the current through P-channel transistors 73 and 74. The current in P-channel transistors 73 and 74 adjusts until it is substantially equal to attenuated differential current $I_{SIGN}/I_{SIGP}$.

During phase 2, switches 68, 69, 79, 81, 83, 87, and 88 are closed, all other switches are open. The gate voltage of P-channel transistor 75 is adjusted by differential amplifier 89 to cause a change in the tail current and transconductance of P-channel transistors 73 and 74. The adjustment of the gate voltage of transistor 75 continues until the differential current in P-channel transistors 73 and 74 equals differential calibration current $I_{CALN}/I_{CALP}$. Since the current in P-channel transistors 73 and 74 was set by differential current $I_{SUM}$ during phase 1, which was $2^N$ times larger than differential calibration current $I_{CALN}/I_{CALP}$, the calibrated current in P-channel transistors 73 and 74 should equal differential calibration current $I_{CALN}/I_{CALP}$.

During phase 3, switches 85, 86, 70, 71, 80, 81, and 83 are again closed, with all other switches open. 4-phase gain adjust sample and hold circuit 49 operates as in phase 1. The current in P-channel transistors 73 and 74 is adjusted until it equals attenuated differential current $I_{SIGN}/I_{SIGP}$.

During phase 4, switches 85, 86, 70, 71, 81, 83, and 80 are open and switches 82, 84, and 79 are closed.. Attenuated differential current $I_{SIGN}/I_{SIGP}$ is coupled to the output terminals and scaled to adjust for attenuator mismatch error. The current in P-channel transistors 73 and 74 flows to the output terminals and is adjusted by a change in the tail current flowing from P-channel transistor 75 in differential pair 72. The change in tail current causes an adjustment in the transconductance of P-channel transistors 73 and 74 which in turn either amplifies or attenuates current attenuated differential current $I_{SIGN}/I_{SIGP}$ to provide adjusted attenuated differential current $I_{ADJP}/I_{ADJN}$. This gain, or attenuation factor is adjusted during phase 2 to account for gain errors in attenuator 50. Thus, 4-phase gain adjust sample and hold circuit 49 effectively adjusts for gain errors in attenuator 50 by changing the transconductance of differential pair 72 in the time between phase 3 and phase 4. The result is that the attenuator scale factor, or mismatch error in attenuator 50, is multiplied by the gain adjust scale factor (from 4 -phase gain adjust sample and hold circuit 49), which provides an almost exact division by $2^N$.

Current sources 63 and 67 are voltage controlled current sources that are controlled by the voltage at the drains of N-channel transistors 62 and 66, respectively, during phase 4. This prevents the drains of N-channel transistors 62 and 66 from floating during phase 4 when switches 68, 69, 70, and 71 are open. Also, controlling current sources 63 and 67 with the drain voltage of N-channel transistors 62 and 66 removes offset errors in 4 -phase gain adjust sample and hold circuit 49 that are caused by device mismatches. In addition, the adjusted current values of current sources 63 and 67 that are established in phase 4 are maintained in phases 1–3.

Figure 3:
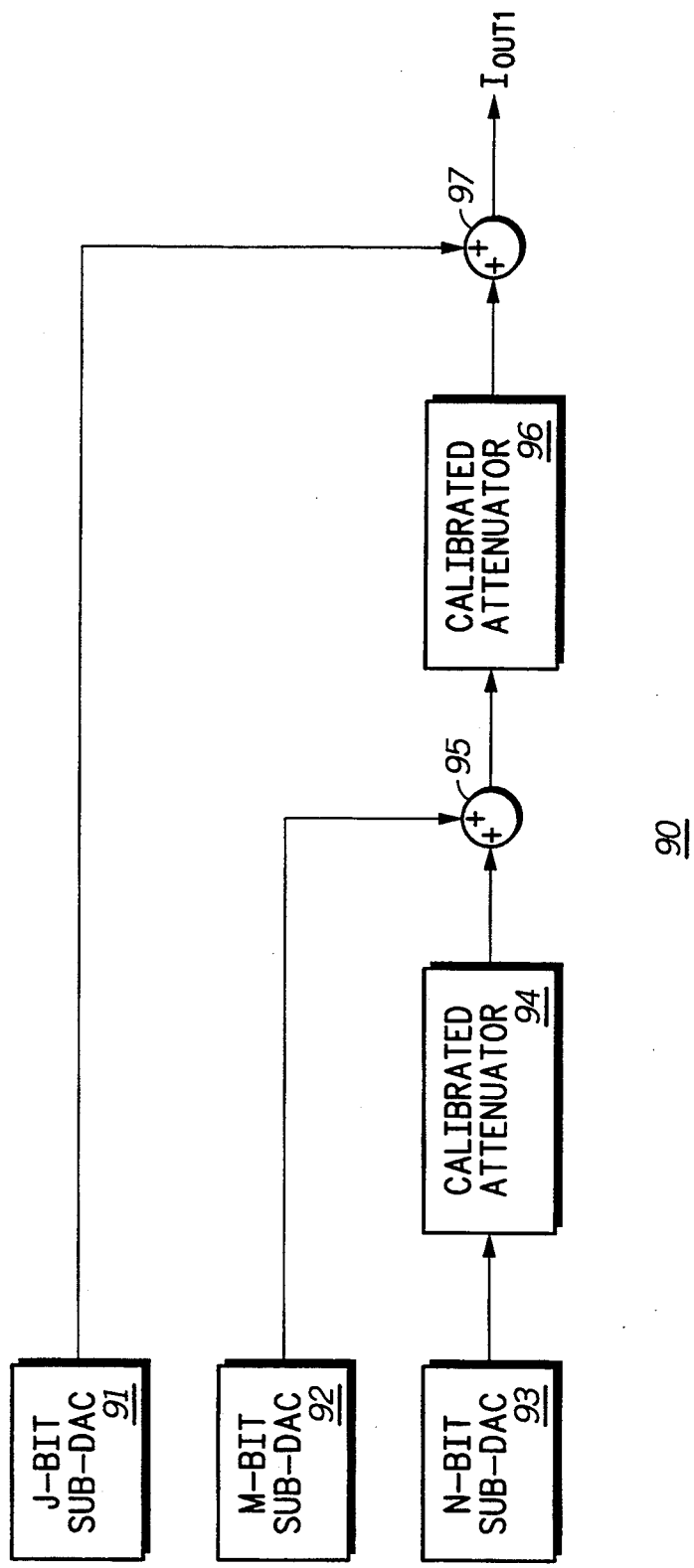
FIG. 3 illustrates in schematic diagram form, a current-mode DAC in accordance with another embodiment of the present invention.

FIG. 3 illustrates in schematic diagram form, three-stage current-mode DAC 90 in accordance with another embodiment of the present invention. Three-stage current-mode DAC 90 converts a K-bit digital signal to an analog signal, and includes J-bit sub-DAC 91, M-bit sub-DAC 92, N-bit sub-DAC 93, calibrated attenuators 94 and 96, and summing elements 95 and 97. Calibrated attenuators 94 and 96 are the same as calibrated attenuator 48 of FIG. 1.

Each sub-DAC has the same structure as sub-DACs 22 and 36 of FIG. 1. J-bit sub-DAC 91 has $2^J+1$ current sample and hold circuits, M-bit sub-DAC 92 has $2^M+1$ current sample and hold circuits, and N-bit sub-DAC 93 has $2^N+1$ current sample and hold circuits, where J+M+N equals K.

Three-stage current-mode DAC 90 illustrates that more than one calibrated attenuator can be used in a multi-stage DAC with multiple sub-DACs. The scale factor of calibrated attenuator 94 is $\frac{1}{2}^N$, and the scale factor of calibrated attenuator 96 is $\frac{1}{2}^M$. The accuracy of calibrated attenuators 94 and 96 becomes more important when used with more than two sub-DACs. For example, attenuator 94 needs a gain accuracy of only N bits since it is processing the N least-significant-bits of the DAC. However, attenuator 96 should have a gain accuracy of M+N bits. The advantage of using a large number of stages is that it reduces the total number of current elements in the DAC.

The total number of current elements for a K-bit DAC converter is equal to $(K/N)(2^N+1)-1$, where N is the number of bits in each sub-DAC. The following table relates the total number of current elements required for a K-bit DAC and a 12-bit DAC.

| N | Total number of elements, K-bit DAC | Total number of elements, 12-bit DAC |
|---|---|---|
| 1 | 3K - 1 | 35 |
| 2 | 5/2K - 1 | 29 |
| 3 | 9/3K - 1 | 35 |
| 4 | 17/4K - 1 | 50 |
| 5 | 33/5K - 1 | 79 |
| 6 | 65/6K - 1 | 129 |

From the table, it can be seen that a DAC having the smallest number of elements can be obtained by using sub-DACs having 2-bits each. High resolution digital-to-analog converters having multiple sub-DACs can be constructed using the calibrated attenuator of the present invention, without having the linearity errors of conventional attenuators that are affected by device mismatch.

While the invention has been described in the context of a preferred embodiment, it will be apparent to those skilled in the art that the present invention may be modified in numerous ways and may assume many embodiments other than that specifically set out and described above. For example, it should be apparent to one skilled in the art that a single-ended DAC could be constructed for receiving a single-ended input signal and providing a single-ended output signal. Accordingly, it is intended by the appended claims to cover all modifications of the invention which fall within the true spirit and scope of the invention.

What is claimed is:

1. A current-mode digital-to-analog converter (DAC), comprising:

a first sub-DAC having a plurality of current sample and hold circuits, the first sub-DAC receiving a reference current and a plurality of least-significant-bits of a K-bit digital signal, where K is an integer, and in response, the first sub-DAC providing a first analog signal corresponding to the plurality of least-significant-bits;

a second sub-DAC having a plurality of current sample and hold circuits, the second sub-DAC receiving the reference current and a plurality of most-significant-bits of the K-bit digital signal, and in response, the second sub-DAC providing a second analog signal corresponding to the plurality of most significant-bits;

an attenuator, coupled to the first sub-DAC, the attenuator attenuating the first analog signal and providing an attenuated first analog signal;

a gain adjust sample and hold circuit for adjusting the attenuated first analog signal with a constant scale factor to compensate for device mismatch errors in the attenuator, and providing an adjusted attenuated first analog signal; and a summing element for receiving the adjusted attenuated first analog signal and the second analog signal, and in response, providing an output analog signal.

2. The current-mode digital-to-analog converter of claim 1, wherein the gain adjust sample and hold circuit receives a calibration current for calibrating the constant scale factor.

3. The current-mode digital-to-analog converter of claim 2, wherein the gain adjust sample and hold circuit comprises:

a first transistor having a first current electrode coupled to a first power supply voltage terminal, a control electrode, and a second current electrode;

a second transistor having a first current electrode coupled to the second current electrode of the first transistor, a control electrode, and a second current electrode;

a third transistor having a first current electrode coupled to the second current electrode of the first transistor, a control electrode, and a second current electrode;

a differential amplifier having a first input terminal coupled to the control electrode of the second transistor, a second input terminal coupled to the control electrode of the third transistor, and an output terminal coupled to the gate of the first transistor;

a fourth transistor having a first current electrode coupled to the control electrode of the second transistor, a control electrode for receiving a first bias voltage, and a second current electrode;

a fifth transistor having a first current electrode coupled to the control electrode of the third transistor, a control electrode coupled to the control electrode of the fourth transistor for receiving the first bias voltage, and a second current electrode;

first switch means, coupled to the second current electrodes of the second and third transistors, for selectively coupling the attenuated first analog signal to the second current electrodes of the second and third transistors;

second switch means for selectively coupling the control electrodes of the second and third transistors to the first and second input terminals, respectively, of the differential amplifier;

third switch means for selectively coupling the output terminal of the differential amplifier to the gate of the first transistor; and fourth switch means for selectively coupling the second current electrodes of the second and third transistors to the summing element.

4. The current-mode digital-to-analog converter of claim 3, further comprising:

a sixth transistor having a first current electrode coupled to the first power supply voltage terminal, a control electrode, and a second current electrode;

a seventh transistor having a first current electrode coupled to the second current electrode of the sixth transistor, a control electrode for receiving a second bias voltage, and a second current electrode coupled to the first current electrode of the fourth transistor;

an eighth transistor having a first current electrode coupled to the first power supply voltage terminal, a control electrode connected to the control electrode of the sixth transistor, and a second current electrode;

a ninth transistor having a first current electrode coupled to the second current electrode of the eighth transistor, a control electrode coupled to the control electrode of the seventh transistor for receiving the second bias voltage, and a second current electrode coupled to the first current electrode of the fifth transistor; and a differential amplifier having a first input terminal for receiving a common-mode reference voltage, a second input terminal coupled to the first current electrodes of the second and third transistors, and an output terminal coupled to the control electrodes of the sixth and eighth transistors.

5. The current-mode digital-to-analog converter of claim 3, wherein the first, second, third, sixth, seventh, eighth, and ninth transistors are metal-oxide semiconductor transistors of a first conductivity type, and the fourth and fifth transistors are metal-oxide semiconductor transistors of a second conductivity type.

6. The current-mode digital-to-analog converter of claim 1, wherein the gain adjust sample and hold circuit is for sampling the attenuated first analog signal, calibrating the constant scale factor, sampling the attenuated first analog signal, and holding and adjusting the attenuated first analog signal for providing the adjusted attenuated first analog signal.

7. The current-mode digital-to-analog converter of claim 1, further comprising:

a third sub-DAC having a plurality of current sample and hold circuits for receiving the reference current and a second plurality of most-significant-bits of the K-bit digital signal, and in response, providing a third analog signal corresponding to the second plurality of most-significant-bits;

a second attenuator, coupled to the summing element, for attenuating the output analog signal and providing an attenuated output analog signal;

a gain adjust sample and hold circuit for adjusting the attenuated output analog signal with a constant scale factor to compensate for device mismatch errors in the second attenuator, and providing an adjusted attenuated output analog signal; and a second summing element for receiving the adjusted attenuated output analog signal and the third analog signal, and in response, providing a second output analog signal.

8. An auto-calibrated current-mode digital-to-analog converter (DAC) for converting a K-bit digital signal to an analog signal, comprising:
- a first sub-DAC for receiving N-bits of the K-bit digital signal, and in response, providing a first analog signal corresponding to the N-bits of the K-bit digital signal;
- a second sub-DAC for receiving M-bits of the K-bit digital signal, and in response, providing a second analog signal corresponding to the M-bits of the K-bit digital signal;
- a calibrated attenuator, comprising: an attenuator, coupled to the first sub-DAC, for attenuating the first analog signal and providing an attenuated first analog signal; and
- a gain adjust sample and hold circuit for adjusting the attenuated first analog signal with a constant scale factor to compensate for device mismatch errors in the attenuator, and providing an adjusted attenuated first analog signal; and
- a summing element for receiving the adjusted attenuated first analog signal and the second analog signal, and in response, providing an output analog signal.

9. The auto-calibrated current-mode digital-to-analog converter of claim 8, wherein first sub-DAC comprises $2^N+1$ equal current elements, the second sub-DAC comprises $2^M+1$ equal current elements, each of the current elements receiving a reference current.

10. The auto-calibrated current-mode digital-to-analog converter of claim 9, further comprising an additional current element, the additional current element for receiving the reference current, and in response, providing a calibrated current to the gain adjust sample and hold circuit for calibrating the constant scale factor.

11. The auto-calibrated current-mode digital-to-analog converter of claim 10, wherein the equal current elements and the additional current element are each characterized as being current sample and hold circuits.

12. The auto-calibrated current-mode digital-to-analog converter of claim 8, wherein the gain adjust sample and hold circuit comprises:
- a first transistor having a first current electrode coupled to a first power supply voltage terminal, a control electrode, and a second current electrode;
- a second transistor having a first current electrode coupled to the second current electrode of the first transistor, a control electrode, and a second current electrode;
- a third transistor having a first current electrode coupled to the second current electrode of the first transistor, a control electrode, and a second current electrode;
- a differential amplifier having a first input terminal coupled to the control electrode of the second transistor, a second input terminal coupled to the control electrode of the third transistor, and an output terminal coupled to the gate of the first transistor;
- a fourth transistor having a first current electrode coupled to the control electrode of the second transistor, a control electrode for receiving a first bias voltage, and a second current electrode;
- a fifth transistor having a first current electrode coupled to the control electrode of the third transistor, a control electrode coupled to the control electrode of the fourth transistor for receiving the first bias voltage, and a second current electrode;
- first switch means, coupled to the second current electrodes of the second and third transistors, for selectively coupling the attenuated first analog signal to the second current electrodes of the second and third transistors;
- second switch means for selectively coupling the control electrodes of the second and third transistors to the first and second input terminals, respectively, of the differential amplifier;
- third switch means for selectively coupling the output terminal of the differential amplifier to the gate of the first transistor; and
- fourth switch means for selectively coupling the second current electrodes of the second and third transistors to the summing element.

13. The auto-calibrated current-mode digital-to-analog converter of claim 12, wherein the gain adjust sample and hold circuit further comprising:
- a sixth transistor having a first current electrode coupled to the first power supply voltage terminal, a control electrode, and a second current electrode;
- a seventh transistor having a first current electrode coupled to the second current electrode of the sixth transistor, a control electrode for receiving a second bias voltage, and a second current electrode coupled to the first current electrode of the fourth transistor;
- an eighth transistor having a first current electrode coupled to the first power supply voltage terminal, a control electrode connected to the control electrode of the sixth transistor, and a second current electrode;
- a ninth transistor having a first current electrode coupled to the second current electrode of the eighth transistor, a control electrode coupled to the control electrode of the seventh transistor for receiving the second bias voltage, and a second current electrode coupled to the first current electrode of the fifth transistor; and
- a differential amplifier having a first input terminal for receiving a common-mode reference voltage, a second input terminal coupled to the first current electrodes of the second and third transistors, and an output terminal coupled to the control electrodes of the sixth and eighth transistors.

14. The auto-calibrated current-mode digital-to-analog converter of claim 13, wherein the first, second, third, sixth, seventh, eighth, and ninth transistors are metal-oxide semiconductor transistors of a first conductivity type, and the fourth and fifth transistors are metal-oxide semiconductor transistors of a second conductivity type.

15. The auto-calibrated current-mode digital-to-analog converter of claim 14, wherein the first conductivity type is P-channel, and the second conductivity type is N-channel.

16. In a current-mode digital-to-analog converter (DAC) for converting a K-bit digital signal to an analog signal, where K is an integer, the DAC comprising a first sub-DAC having a plurality of current elements, a second sub-DAC having a plurality of current elements, and an attenuator, a method for removing device mismatch effects in the attenuator which cause nonlinearity errors in the current-mode digital-to-analog converter, comprising the steps of:

providing N-bits of the K-bit digital signal to the first sub-DAC, where N is an integer less than K, and in response, the first sub-DAC providing a first analog signal corresponding to the N-bits of the K-bit digital signal;

providing M-bits of the K-bit digital signal to the second sub-DAC, where M is an integer less than K, and in response, the second sub-DAC providing a second analog signal corresponding to the M-bits of the K-bit digital signal;

attenuating the first analog signal, and in response, providing an attenuated first analog signal;

summing a current from each current element of the plurality of current elements in the first DAC to provide a calibration current;

dividing the calibration current by the quantity $2^N$ minus the mismatch error;

sampling the calibration current;

calibrating a scale factor, the scale factor for compensating for the nonlinearity error caused by device mismatch;

sampling the attenuated first analog signal; and holding and adjusting the attenuated first analog signal with the scale factor for providing an adjusted attenuated first analog signal.

17. The method of claim 16, further comprising the step of summing the adjusted attenuated first analog signal with the second analog signal.

18. The method of claim 16, wherein the step of summing a current further comprises summing a current from $2^N+1$ equal current elements.

19. The method of claim 16, wherein the step of providing N-bits of the K-bit digital signal comprises providing a least-significant-bits of the K-bit digital signal to the first sub-DAC.

20. The method of claim 16, wherein the step of providing M-bits of the K-bit digital signal comprises providing a most-significant-bits of the K-bit digital signal to the second sub-DAC.

* * * * *